(12) United States Patent
Tang

(10) Patent No.: US 10,475,884 B2
(45) Date of Patent: *Nov. 12, 2019

(54) TUNNEL FIELD-EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Poren Tang, Beijing (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/036,693

(22) Filed: Jul. 16, 2018

(65) Prior Publication Data

US 2019/0019865 A1    Jan. 17, 2019

(30) Foreign Application Priority Data

Jul. 17, 2017   (CN) .......................... 2017 1 0580672

(51) Int. Cl.
 *H01L 29/08* (2006.01)
 *H01L 29/66* (2006.01)
 (Continued)

(52) U.S. Cl.
 CPC ...... *H01L 29/0847* (2013.01); *H01L 21/3065* (2013.01); *H01L 21/30604* (2013.01);
 (Continued)

(58) Field of Classification Search
 CPC .......... H01L 29/0847; H01L 29/66636; H01L 29/0692; H01L 29/66795; H01L 21/30612; H01L 21/30621; H01L 21/3245; H01L 21/26546; H01L 29/66522; H01L 29/7851; H01L 21/30604; H01L 21/3065;
 (Continued)

(56) References Cited

U.S. PATENT DOCUMENTS

2012/0056276 A1* 3/2012 Cheng ............... H01L 21/26586
                                                    257/408
2018/0308959 A1* 10/2018 Afzalian ........... H01L 29/66977

* cited by examiner

*Primary Examiner* — Anthony Ho
(74) *Attorney, Agent, or Firm* — Anova Law Group, PLLC

(57) ABSTRACT

Tunnel field-effect transistors and fabrication methods are provided. An exemplary fabrication method includes providing a semiconductor substrate; forming a gate structure having a first side and an opposing second side on the semiconductor substrate; and forming a first doped source/drain layer in the semiconductor substrate at the first side of the gate structure. The first doped source/drain layer is doped with a first type of doping ions and a first contact interface between the first doped source/drain layer and the channel region has protruding structures protruding toward a channel region under the gate structure. The method also includes forming a second doped source/drain layer in the semiconductor substrate at the second side of the gate structure. The second doped source/drain layer is doped with a second type of doping ions having a conductivity opposite to the first doped source/drain layer.

15 Claims, 4 Drawing Sheets

(51) Int. Cl.
*H01L 21/324* (2006.01)
*H01L 21/3065* (2006.01)
*H01L 21/306* (2006.01)
*H01L 29/78* (2006.01)
*H01L 29/06* (2006.01)
*H01L 21/033* (2006.01)
*H01L 21/265* (2006.01)
*H01L 29/167* (2006.01)
*H01L 29/207* (2006.01)
*H01L 29/49* (2006.01)

(52) U.S. Cl.
CPC .. *H01L 21/30612* (2013.01); *H01L 21/30621* (2013.01); *H01L 21/324* (2013.01); *H01L 21/3245* (2013.01); *H01L 29/0692* (2013.01); *H01L 29/66522* (2013.01); *H01L 29/66636* (2013.01); *H01L 29/66795* (2013.01); *H01L 29/7851* (2013.01); H01L 21/0332 (2013.01); H01L 21/26513 (2013.01); H01L 21/26546 (2013.01); H01L 21/26586 (2013.01); H01L 29/167 (2013.01); H01L 29/207 (2013.01); H01L 29/4916 (2013.01)

(58) Field of Classification Search
CPC ............. H01L 21/324; H01L 21/26586; H01L 21/26513; H01L 29/207; H01L 21/0332; H01L 29/4916; H01L 29/167
See application file for complete search history.

TUNNEL FIELD-EFFECT TRANSISTOR AND FABRICATION METHOD THEREOF

CROSS-REFERENCES TO RELATED APPLICATIONS

This application claims the priority of Chinese patent application No. 201710580672.8, filed on Jul. 17, 2017, the entirety of which is incorporated herein by reference.

FIELD OF THE DISCLOSURE

The present disclosure generally relates to the field of semiconductor manufacturing technologies and, more particularly, relates to tunnel field-effect transistors and fabrication methods.

BACKGROUND

With the continuous development of semiconductor technologies, the critical dimension (CD) of the semiconductor devices has been continuously reduced. The reduction of the critical dimension of the semiconductor devices means that more transistors can be formed in a single chip. However, with the rapid reduction of the size of the transistors, the CMOS field-effect transistors are facing more challenges. For example, the short-channel effect is increased; the leakage current is increased; and the slope of the subthreshold voltage has the limitation of 60 mV/dec at the room temperature.

To adapt to the reduction of the size of the transistors, and to reduce the short-channel effect and reduce the slope of the subthreshold voltage, tunnel field-effect transistors (TFETs) have been developed. TFETs are a type of metal oxide semiconductor-controlled PIN diodes. TFETs utilize the quantum tunneling effect as the major mechanism to control the current; and a gate voltage to control the shape of the potential distribution inside the devices so as to affect the conditions to have the quantum tunneling effect. When the conditions are met, the TFET is turned on. When the conditions are not met, the current is rapidly reduced; and the TFET is turned off. The TFETs have the advantages of small slope of the subthreshold voltage and small off-current.

However, there is still a need to further reduce the slope of the subthreshold voltage and increase the on-currents of the TFETs. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate; forming a gate structure having a first side and an opposing second side on the semiconductor substrate; and forming a first doped source/drain layer in the semiconductor substrate at the first side of the gate structure. The first doped source/drain layer is doped with a first type of doping ions and a first contact interface between the first doped source/drain layer and the channel region has protruding structures protruding toward a channel region under the gate structure. The method also includes forming a second doped source/drain layer in the semiconductor substrate at the second side of the gate structure. The second doped source/drain layer is doped with a second type of doping ions having a conductivity opposite to the first doped source/drain layer.

Another aspect of the present disclosure includes a tunnel field-effect transistor (TFET). The tunnel field-effect transistor (TFET) includes a semiconductor substrate; a gate structure having a first side and an opposing second side formed on the semiconductor substrate; and a first doped source/drain layer formed in the semiconductor substrate at the first side of the gate structure. The first doped source/drain layer is doped with a first type of doping ions and a contact surface between the first doped source/drain layer and a channel region of the semiconductor substrate has protruding structures protruding toward the channel region under the gate structure. The tunnel field-effect transistor (TFET) also includes a second doped source/drain layer in the semiconductor substrate at the second side of the gate structure. The second doped source/drain layer is doped with a second type of doping ions having a conductive type opposite to the first source/drain doping layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
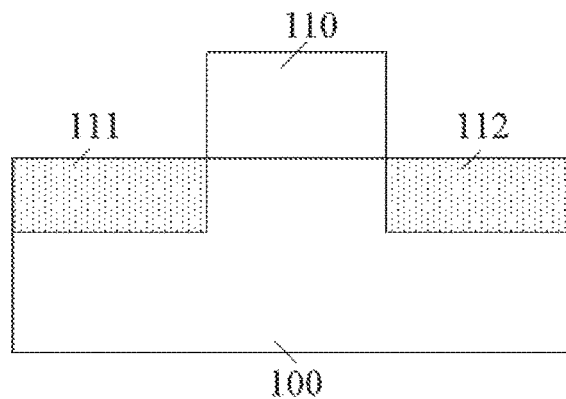
FIG. 1 illustrates a tunnel field-effect transistor.

FIG. 1 illustrates a tunnel field-effect transistor (TFET). As shown in FIG. 1, the TFET includes a semiconductor substrate 100; a gate structure 110 on the semiconductor substrate 100; and a source region 111 and a drain region 112 in the semiconductor substrate at both sides of the gate structure 110. The source region 111 is doped with a first type of ions. The drain region 112 is doped with a second type of ions. The conductive type of the first type of ions is opposite to the conductive type of the second type of ions.

The portion of the semiconductor substrate 100 between the source region 111 and the drain region 112 forms a channel region. When a voltage is applied on the gate structure 110, the energy band of the channel region is reduced. When the bottom of the valance band of the channel region is below the top of the conduction band of the source region 111, the electrons in the conduction band of the source region 111 are able to tunnel through the potential barrier between the source region 111 and the channel region by the band-to-band tunneling effect to turn on the TFET.

However, to reduce the power-consumption of the TFET, when the TFET is in operation, the voltage between the source region 111 and the semiconductor substrate 100 is relatively low. The electrons in the conduction band of the source region 111 are not easy to tunnel through the potential barrier between the source region 111 and the channel region. Thus, under a constant gate voltage, the current in the drain region 112 is relatively small. Accordingly, the slope of the subthreshold voltage is relatively large; and the on-current is relatively small.

The present disclosure provides a TFET and a fabrication method. The method for fabricating a TFET may include providing a semiconductor substrate; forming a gate structure having a first side and an opposing second side on the semiconductor substrate; forming a first doped source/drain layer in the semiconductor substrate at the first side. The first doped source/drain layer doped with a first type of doping ions; and the contact interface between the first doped source/drain layer and the channel region in the semiconductor substrate may have protruding structures. When the channel region is turned on, the protruding structures may be able to increase the strength of the electric field between the first doped source/drain layer and the second doped source/drain layer. Accordingly, the on-current of the TFET may be increased.

Figure 12:
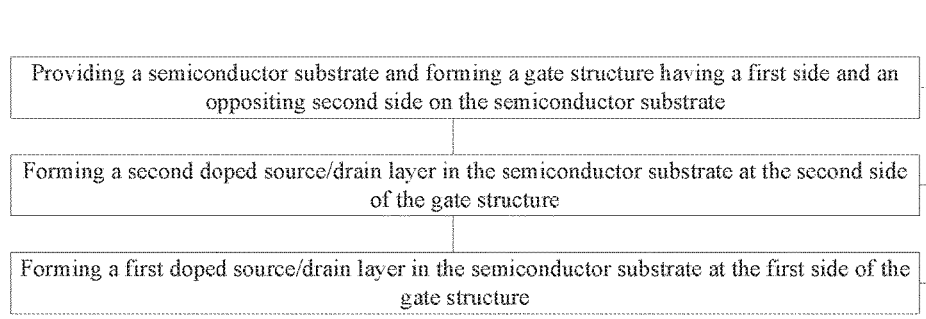
FIG. 12 illustrates an exemplary fabrication process of a tunnel field-effect transistor consistent with various disclosed embodiments.

FIG. 12 illustrates an exemplary fabrication process of a TFET consistent with various disclosed embodiments. FIGS. 2-9 illustrate structures corresponding to certain stages during the exemplary fabrication process.

Figure 2:
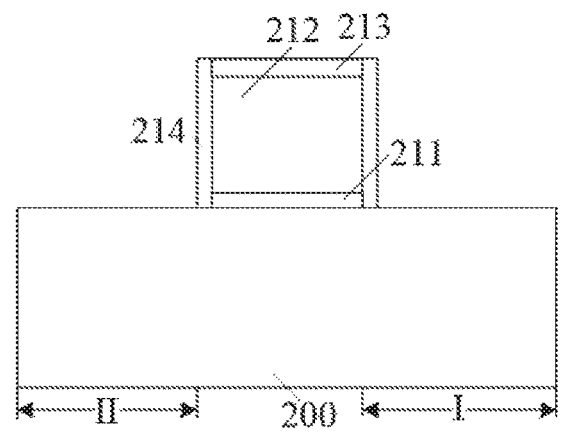
FIGS. 2-9 illustrate structures corresponding to certain stages during an exemplary fabrication process of a tunnel field-effect transistor consistent with various disclosed embodiments.

As shown in FIG. 12, at the beginning of the fabrication process, a semiconductor substrate with certain structures is provided (S101). FIG. 2 illustrates a corresponding semiconductor structure.

As shown in FIG. 2, a semiconductor substrate 200 is provided. A gate structure may be formed on the semiconductor substrate 200. The portion of the semiconductor substrate 200 under the gate structure is the channel region. The gate structure may include a first side I and an opposing second side II, as shown in FIG. 2.

In one embodiment, the semiconductor substrate 200 is an intrinsic semiconductor substrate. In some embodiments, the semiconductor substrate 200 may also be made of single crystalline Group III-V compound semiconductor, such as GaAs, InGaAs, InAs, InAlAs, or InP, etc.

In one embodiment, the semiconductor substrate 200 may be made of silicon, germanium, silicon germanium, or silicon carbide.

The gate structure may include a gate dielectric layer 211 on the semiconductor substrate 200 and a gate electrode layer 212 on the gate dielectric layer 211. A mask layer 213 may be formed on the gate electrode layer 212.

In one embodiment, the gate dielectric layer 211 is made of silicon oxide. In some embodiments, the gate dielectric layer may be made of high dielectric constant (high-K, K>3.9) material, etc.

In one embodiment, the gate electrode layer 212 is made of polysilicon. In some embodiments, the gate electrode layer may be made of polycrystalline germanium, or polycrystalline silicon germanium, etc.

The mask layer 213 may be made of any appropriate material. In one embodiment, the mask layer 213 is made of silicon nitride.

Further, as shown in FIG. 2, sidewall spacers 214 may be formed on the side surfaces of the gate structure. The sidewall spacers 214 may be used to define the positions of the subsequently formed first doped source/drain layer and second doped source/drain layer to prevent the first doped source/drain layer and the second doped source/drain layer from being too close to the channel region. The short-channel effect may be reduced.

Figure 3:
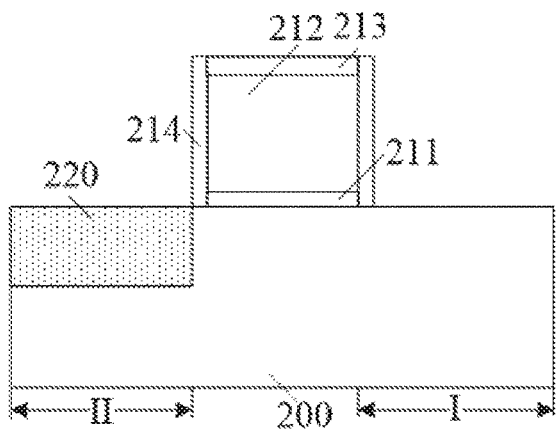

Returning to FIG. 12, after forming the gate structure, a second doped source/drain layer may be formed (S102). FIG. 3 illustrates a corresponding semiconductor structure.

As shown in FIG. 3, a second doped source/drain layer 220 is formed in the substrate 200 at the second side II of the gate structure. The second doped source/drain layer 220 may be doped with a second type of doping ions.

In one embodiment, the second doped source/drain layer 220 is used as the drain region of the TFET. In some embodiments, the second doped source/drain layer may be used as the source region of the TFET.

In some embodiments, a first doped source/drain layer may be formed in the semiconductor substrate at the first side of the gate structure. Then, the second doped source/drain layer may be formed in the semiconductor substrate at the second side of the gate structure.

In one embodiment, the second type of doping ions are N-type ions, such as phosphorus ions, arsenic ions, or antimony ions, etc. In some embodiments, the semiconductor substrate may be made of Group III-V semiconductor, such as InGaAs, etc.; and the N-type ions may be silicon ions, or tellurium (Te) ions, etc.

In one embodiment, the second doped source/drain layer 220 may be formed by performing a source/drain ion implantation process on the semiconductor substrate 200 at the second side II of the gate structure. In some embodiments, the process for forming the second doped source/drain layer may include etching the semiconductor substrate at the second side of the gate structure to form a source/drain trench in the semiconductor substrate at the second side of the gate structure; and forming a second doped source/drain layer in the trench by an epitaxial growth process.

In some embodiments, the contact interface between the second doped source/drain layer and the channel region may have protruding structures. The process for forming the second doped source/drain layer may include forming a source/drain trench having source/drain grooves on its side surface; and forming a second doped source/drain layer in the source/drain trench.

A first doped source/drain layer may be subsequently formed in the semiconductor substrate at the first side of the gate structure. The first doped source/drain layer may be doped with a first type of doping ions. The contact interface between the first doped source/drain layer and the channel region may have protruding structures. The conductive type of the first type of doping ions may be opposite to the conductive type of the second type of doping ions.

When the channel region is turned on, the protruding structures may be able to increase the electric field between the first doped source/drain layer and the second doped source/drain layer. After the channel region is turned on, a potential barrier layer may be formed between the channel region and the first doped source/drain layer, or a potential barrier layer may be formed between the channel region and the second doped source/drain layer. The increase of the electric field between the first doped source/drain layer and the second source/drain layer may be able to increase the possibility for the electrons to tunnel through the potential barrier layer. Accordingly, the on-current of the semiconductor structure may be increased.

In one embodiment, the process for forming the first doped source/drain layer may include forming a trench in the semiconductor substrate 200 at the first side I of the gate structure. The side surface of the trench adjacent to the channel region may have grooves. After forming the trench, the first doped source/drain layer may be formed in the first trench and the grooves. FIGS. 4-9 illustrate structures corresponding to certain stages during an exemplary fabrication process of the first doped source/drain layer (S103 shown in FIG. 12).

In one embodiment, the process for forming the trench may include performing a plurality of selective ion implantation processes on the semiconductor substrate 200 at the first side I of the gate structure to form a doped structure in the semiconductor substrate 200 at the first side I of the gate structure. The contact interface between the doped structure and the channel region may have protruding structures protruding toward the channel region. Then, the doped structure may be removed to form the trench. FIGS. 4-8 illustrate structures corresponding to certain stages during an exemplary fabrication process of the trench.

In one embodiment, the doped structure may be formed by performing, e.g., three times of selective ion implantation processes, although any number of times of the selective ion implantation processes may be used to form the doped structure. FIGS. 4-7 illustrate structures corresponding to certain stages during the formation of the doped structure.

Using the selective ion implantation processes to form the doped structure may increase the etching selectivity ratio during the subsequent process for forming the trench. Accordingly, the process difficulty for forming the trench may be reduced.

Figure 4:
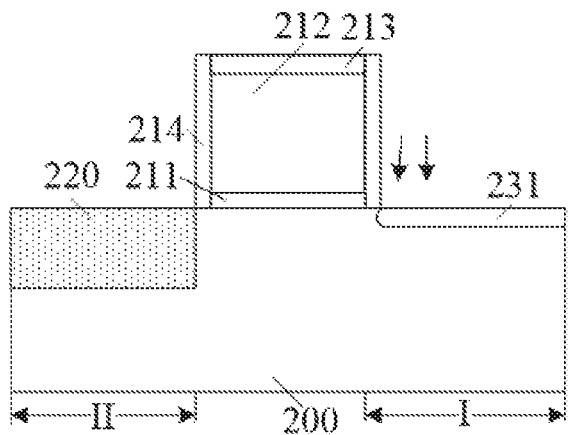

As shown in FIG. 4, a first selective ion implantation process may be performed on the semiconductor substrate 200 at the first side I of the gate structure to form a first doped region 231 in the semiconductor substrate 200 at the first side I of the gate structure.

In one embodiment, the ions implanted by the first selective ion implantation process are doping ions. After the first selective ion implantation process, the doping ions may be easy to diffuse; and the contact interface between the first doped region 231 and the portion of the semiconductor substrate 200 at the channel region may be a cylindrical surface. The generatrix of the contact interface between the first doped region 231 and the portion of the semiconductor substrate 200 at the channel region may be along the length (or extending) direction of the gate structure. Thus, the contact interface between the first doped region 231 and the portion of the semiconductor substrate 200 under the gate structure may have protruding structures protruding toward the channel region.

In one embodiment, the first selective ion implantation process may include performing a tilt ion implantation process on the semiconductor substrate 200 at the first side I of the gate structure; and performing a vertical ion implantation process on the semiconductor substrate 200 at the first side I of the gate structure.

In one embodiment, the vertical ion implantation process may be performed after performing the tilt ion implantation process. In some embodiments, the vertical ion implantation process may be performed before the tilt ion implantation process. In other embodiments, the first selective ion implantation process may include one of the tilt ion implantation process and the vertical ion implantation process.

The tilt ion implantation process may be performed toward the gate structure. The implanting angle of the tilt ion implantation process may refer to the acute angle between the direction of the ion beam and the normal of the surface of the semiconductor substrate 200.

In one embodiment, the implanting angle is approximately 7°. In some embodiments, the implanting angle may be in a range of approximately 0° to 8°.

The tilt ion implantation process may be used to reduce the distance between the first doped layer 231 and the central line of the gate structure to increase the stress applied by the subsequently formed first doped source/drain layer to the channel region. Accordingly, the carrier mobility of the channel region may be increased.

The direction of the ion beam of the vertical ion implantation process may perpendicular to the surface of the semiconductor substrate 200.

The energy of the vertical ion implantation process and the tilt ion implantation process may be any appropriate value. If the energy of the vertical ion implantation process and the tilt ion implantation process is too large, the depth of the first doped layer 231 may be too large, it may not aid to further dope the semiconductor substrate 200 at the first side I of the gate structure. If the energy of the vertical ion implantation process and the tilt ion implantation process is too small, the ions may not be easy to be doped into the semiconductor substrate 200. Thus, in one embodiment, the energy of the vertical ion implantation process and the tilt ion implantation process may be in a range of approximately 4.5 KeV-5.5 KeV.

The dosage of the vertical ion implantation process and the tilt ion implantation process may be any appropriate value. If the dosage of the vertical ion implantation process and the tilt ion implantation process is too small, it may not aid to change the etching rate of the semiconductor substrate 200 at the first side I of the gate structure during the subsequent process for forming the trench 240. If the dosage of the vertical ion implantation process and the tilt ion implantation process is too large, it may cause a waste of material. Thus, in one embodiment, the dosage of the vertical ion implantation process and the tilt ion implantation process may be in a range of approximately $1.8E14$ atoms/cm$^2$-$2.2E14$ atoms/cm$^2$.

Figure 5:
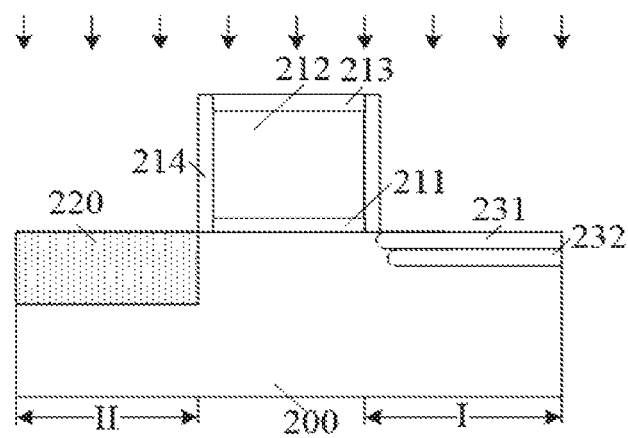

Further, as shown in FIG. 5, after forming the first doped layer 231, a second selective ion implantation process may be performed on the semiconductor substrate 200 at the first side I of the gate structure to form a second doped region 232. The first doped region 231 may be on the second doped region 232.

In one embodiment, the second selective ion implantation process is performed after performing the first selective ion implantation process. In some embodiments, the second selective ion implantation process may be performed before the first selective ion implantation process.

After the second selective ion implantation process, the doping ions may be easy to diffuse; and the contact interface between the second doped region 232 and the portion of the semiconductor substrate 200 at the channel region may be a cylindrical surface. The generatrix of the contact interface between the second doped region 232 and the portion of the semiconductor substrate 200 at the channel region may be along the length (or extending) direction of the gate structure. Thus, the contact interface between the second doped region 232 and the portion of the semiconductor substrate 200 under the gate structure may have protruding structures protruding toward the channel region.

The first doped region 231 may be on the top of the second doped region 232. Thus, the implanting energy of the second selective ion implantation process may be greater than the implanting energy of the first selective ion implantation process.

In one embodiment, the first doped region 231 may contact with the second doped region 232. Thus, there may be no un-doped semiconductor substrate 200 between the first doped region 231 and the second doped region 232. Accordingly, it may help subsequently etching the doped structure to form the trench.

The energy of the second selective ion implantation process may be any appropriate value. If the energy of the second selective ion implantation process is too small, it may be uneasy to form the second doped region 232 under the first doped region 231. Accordingly, the depth of the doped structure may not be increased; and it may be difficult to subsequently form the trench. If the energy of the second selective ion implantation process is too large, it may be easy to have an un-doped portion of the semiconductor substrate 200 between the first doped region 231 and the second doped region 232. Accordingly, the rate for subsequently etching the doped structure may be affected. Thus, the implanting energy of the second selective ion implantation process may be in a range of approximately 7.2 KeV-8.8 KeV.

The dosage of the second selective implantation process may be any appropriate value. If the dosage of the second selective implantation process is too small, it may not aid to change the etching rate of the semiconductor substrate 200 at the first side I of the gate structure during subsequently forming the trench. If the dosage of the second selective implantation process is too large, it may cause a waste of material. Thus, in one embodiment, the dosage of the second selective ion implantation process may be in a range of approximately 2.7E14 atoms/cm$^2$-3.3E14 atoms/cm$^2$.

The implanting angle of the second selective ion implantation process may be referred to the acute angle between the direction of the ion beam and the normal of the surface of the semiconductor substrate 200. The direction of the ion beam of the second selective ion implantation process may toward the gate structure.

The implanting angle of the second selective ion implantation process may be any appropriate value. If the implanting angle is too large, it may cause the second doped region 232 to be too close to the central line of the gate structure. The control ability of the gate structure to the relatively deep second doped region 232 may be relatively weak; and it may be easy to have a short-channel effect. Further, if the dosage of the second selective ion implantation process is relatively large, the implantation angle of the second selective ion implantation process should not be too large. In one embodiment, the implanting angle of the second selective ion implantation process may be in a range of approximately 0°-2°.

Figure 6:
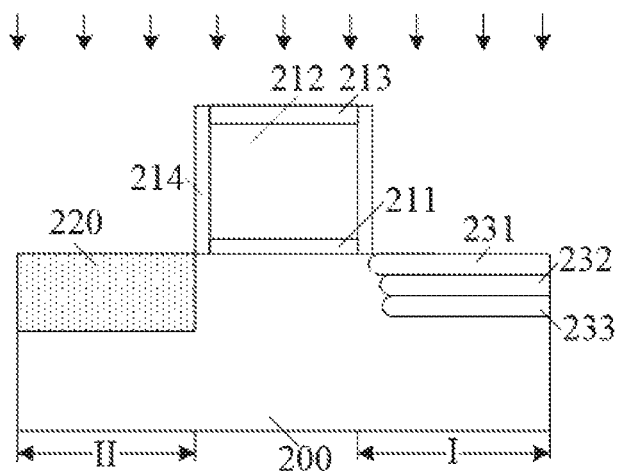

Further, as shown in FIG. 6, after performing the second selective ion implantation process to form the second doped region 232, a third doped region 233 may be formed by a third selective ion implantation process. The second doped region 232 may be above the third doped region 233.

In one embodiment, the third selective ion implantation process may be performed after the second selective ion implantation process. In some embodiments, the third selective ion implantation process may be performed before the second selective ion implantation process.

In one embodiment, the third ion implantation process may be performed after the first selective ion implantation process. In some embodiments, the third selective ion implantation process may be performed before the first selective ion implantation process.

After the third selective ion implantation process, the doping ions in the third doped region may be easy to diffuse; and the contact interface between the third doped region 233 and the portion of the semiconductor substrate 200 under the gate structure may be a cylindrical surface. The generatrix of the contact interface between the third doped region 233 and the portion of the semiconductor substrate 200 under the gate structure may be along the length direction of the gate structure. Thus, the contact interface between the third doped region 233 and the portion of the semiconductor substrate 200 under the gate structure may have protruding structures protruding toward the channel region.

The second doped region 231 may be on the top of the third doped region 232. Thus, the implanting energy of the third selective ion implantation process may be greater than the implanting energy of the second selective ion implantation process.

In one embodiment, the third doped region 233 may be in contact with the second doped region 232. Thus, there may be no un-doped semiconductor substrate 200 between the third doped region 233 and the second doped region 232. Accordingly, it may help subsequently etching the doped structure to form the trench.

The energy of the third selective ion implantation process may be any appropriate value. If the energy of the third selective ion implantation process is too small, it may be uneasy to cause the third doped region 233 to be under the second doped region 232. Accordingly, the depth of the doped structure may not be increased; and it may be difficult to subsequently form the trench. If the energy of the third selective ion implantation process is too large, it may be easy to have a portion of the un-doped the semiconductor substrate 200 between the third doped region 233 and the second doped region 232. Accordingly, the rate for subsequently etching the doped structure may be affected. Thus, the implanting energy of the third selective ion implantation process may be in a range of approximately 10.5 KeV-13.5 KeV.

The dosage of the third selective implantation process may be any appropriate value. If the dosage of the third selective implantation process is too small, it may not aid to change the etching rate of the semiconductor substrate 200 at the first side I of the gate structure during subsequently forming the trench. If the dosage of the third selective implantation process is too large, it may cause a waste of material. Thus, in one embodiment, the dosage of the third selective ion implantation process may be in a range of approximately 3.6E14 atoms/cm$^2$-4.4E14 atoms/cm$^2$.

The implanting angle of the third selective ion implantation process may be referred to the acute angle between the direction of the ion beam and the normal of the surface of the semiconductor substrate 200. The direction of the ion beam of the third selective ion implantation process may toward the gate structure.

The implanting angle of the third selective ion implantation process may be any appropriate value. If the implanting angle is too large, it may cause the third doped region 233 to be too close to the central line of the gate structure. The control ability of the gate structure to the relatively deep third doped region 233 may be relatively weak; and it may be easy to have a short-channel effect. Further, if the dosage of the third selective ion implantation process is relatively large, the implantation angle of the third selective ion implantation process should not be too large. Thus, in one embodiment, the implanting angle of the third selective ion implantation process may be in a range of approximately 0°-2°.

In one embodiment, doping the semiconductor substrate 200 at the first side I of the gate structure may change the etching rate of the semiconductor substrate 200. The doping ions doped into the semiconductor substrate 200 by the ion implantation process may be N-type ions, P-type ions, or neutral ions, etc. For example, the doping ions may include one or more of phosphorus ions, germanium ions, arsenic ions, boron ions, $BF_2^+$ ions, carbon ions, silicon ions, and nitrogen ions, etc.

Figure 7:
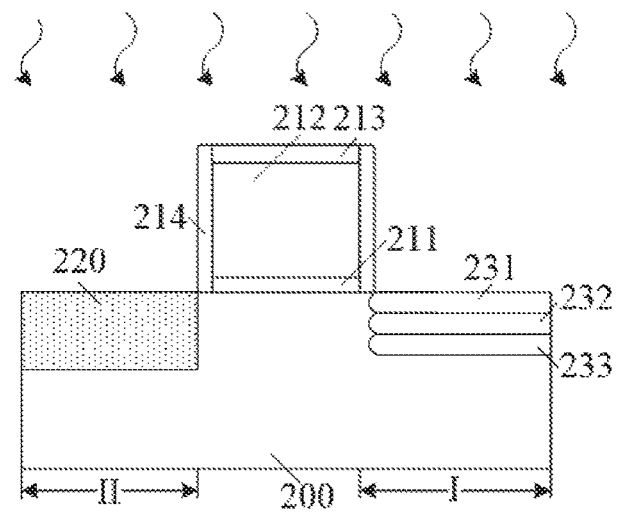

Further, as shown in FIG. 7, after forming the third doped region 233, a thermal annealing process may be performed. The thermal annealing process may be used to cause the doping ions in the doped structure to diffuse so as to allow the doing ions to uniformly distribute in the doped structure. Accordingly, during subsequently etching the doped structure, the etch rate of the doped structure may be uniform.

Further, in one embodiment, the implanting angle of the second selective ion implantation process and the implanting angle of the third selective ion implantation process may be smaller than the implanting angle of the tilt ion implantation process in the first selective ion implantation process. Thus, a first distance between the side surface of the first doped region 231 adjacent to the gate structure and the central line of the gate structure may be smaller than a second distance between the side surface of the second doped region 232 adjacent to the gate structure and the central line of the gate structure; and the first distance between the side surface of the first doped region 231 adjacent to the gate structure and the central line of the gate structure may be smaller than a third distance between the side surface of the third doped region 233 adjacent to the gate structure and the central line of the gate structure. Further, the implanting dosage of the second selective ion implantation process and the implanting dosage of the third selective ion implantation process may be greater than the implanting dosage of the first selective ion implantation process. Thus, during the thermal annealing process, the diffusion rate of the doping ions of the second doped region and the diffusion rate of the doping ions of the third doped region into the semiconductor substrate 200 under the gate structure may be relatively large. Accordingly, after the thermal annealing process, the first distance between the side surface of the first doped region 231 adjacent to the gate structure and the central line of the gate structure may be approximately the same as the second distance between the side surface of the second doped region 232 adjacent to the gate structure and the central line of the gate structure; and the first distance between the side surface of the first doped region 231 adjacent to the gate structure and the central line of the gate structure may be approximately the same as the third distance between the side surface of the third doped region 233 adjacent to the gate structure and the central line of the gate structure.

In some embodiments, the first distance between the side surface of the first doped region adjacent to the gate structure and the central line of the gate structure may be different from the second distance between the side surface of the second doped region adjacent to the gate structure and the central line of the gate structure; and the first distance between the side surface of the first doped region adjacent to the gate structure and the central line of the gate structure may be different from the third distance between the side surface of the third doped region adjacent to the gate structure and the central line of the gate structure.

Figure 8:
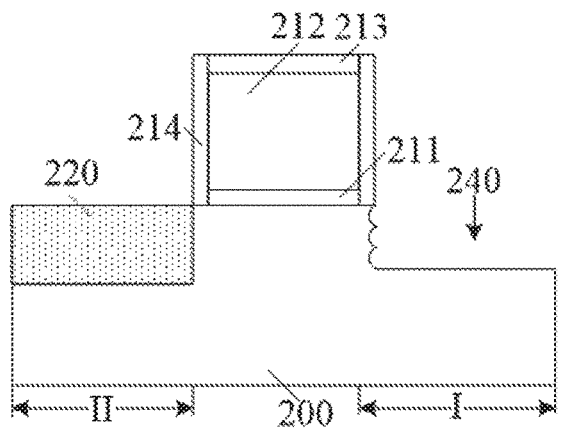

Further, as shown in FIG. 8, after forming the doped structure and the protruding structures, the doped structure and the protruding structures may be removed, and a trench 240 may be formed. The trench 240 may be used to host the subsequently formed first doped source/drain layer. That is, the first doped source/drain layer may be subsequently formed in the trench 240.

The doped structure may be removed by any appropriate process, such as a wet etching process, or a wet etching process, etc.

Because the doped structure is doped with the doping ions, when removing the doped structure, the etching selective ratio between the doped structure and the semiconductor substrate 200 may be relatively large. Accordingly, the doped structure may be easily removed; and the consumption of the un-doped semiconductor substrate 200 may be reduced.

The process for removing the doped structure may include performing a first etching process on the semiconductor substrate at the first side I of the gate structure to form an initial trench 240 in the semiconductor substrate 200 at the first side I of the gate structure; and performing a second etching process on the side surface of the initial trench 240 to form grooves on the side surface of the initial trench 240 adjacent to the gate structure.

The grooves may be used to host the protruding structures of the subsequently formed first doped source/drain layer.

The first etching process may include an anisotropic dry etching process, etc. The second etching process may include an isotropic dry etching process or a wet etching process, etc.

The etching gas of the first etching process may include one or more of $CF_4$, $CH_3F$, HBr, $Cl_2$, Ar, $N_2$, and $O_2$, etc. The flow rate of the etching gas may be in a range of approximately 50 sccm-1000 sccm.

The etching solution of the second etching process may include one or more of a solution of $NH_4OH$, NaOH, KOH, $H_2O_2$, $H_2O$, HCl, HF, and $NH_4F$, etc.

In the first selective etching process, the vertical etching rate may be smaller than the lateral etching rate. The side surfaces of the initial trench 240 formed by the first selective etching process may be relatively smooth. In the second selective etching process, the lateral etching rate may be relatively large, the protruding structures of the doped structure may be removed. Accordingly, the grooves may be formed in the side surface of the initial trench 240 adjacent to the gate structure.

Figure 9:
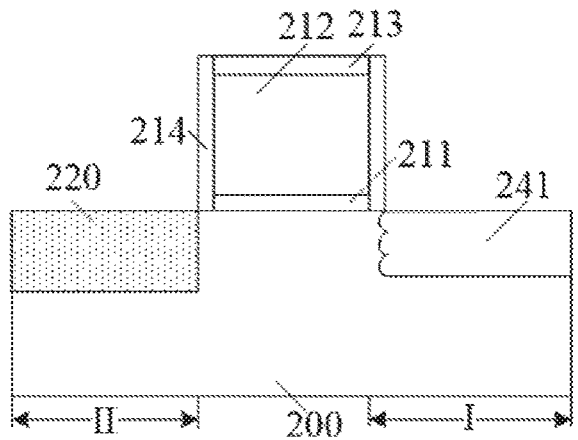

Further, as shown in FIG. 9, after forming the trench 240, a first doped source/drain layer 241 may be formed in the trench 240. The first doped source/drain layer 241 may be doped with a first type of doping ions.

The first doped source/drain layer 241 may be used to form the source region of the TFET.

In one embodiment, the TFET is a N-type transistor. After the channel region is turned on, the conductive type of the first doped source/drain layer 241 is opposite to the conductive type of the channel region, a potential barrier layer may be formed between the first doped source/drain layer 241 and the channel region. The contact interface between the first doped source/drain layer 241 and the semiconductor substrate 200 at the channel region may have the protruding structures, the electric field on the contact interface between the first doped source/drain layer 241 and the channel region may be relatively large because of the tip-charging effect. Thus, electrons may be easy to tunnel through the barrier layer by the tunneling effect to form an electric current. Accordingly, the on-current of the semiconductor structure may be increased.

The first doped source/drain layer 241 may be formed by forming an epitaxial layer in the trench 240. The epitaxial layer may be in situ doped with a first type of doping ions.

Because the side surface of the trench 240 adjacent to the gate structure may have grooves, during the epitaxial growth process, the epitaxial layer may fill the grooves. The portions of the epitaxial layer in the grooves may form the protruding structures after the in situ doping process.

In one embodiment, the first type of doping ions are P-type ions.

In one embodiment, the epitaxial layer is made of silicon, germanium, or silicon germanium, the P-type ions may be boron ions, gallium ions, or $BF_2^+$ ions, etc. In some embodiments, the epitaxial layer may be made of Group III-V single crystalline compound semiconductor material, such as GaAs, InGaAs, InAs, InAlAs, or InP; and the P-type ions may be carbon ions, magnesium ions, or manganese ions, etc.

In one embodiment, the trench 240 and the grooves may be formed by removing the doped structure and the protruding structures; and the first doped source/drain layer 241 may be formed in the trench 240. When forming the first doped source/drain layer 241, the concentration of the first type of doping ions in the first doped source/drain region 241 may be precisely controlled; and the distribution of the first type of doping ions in the first doped source/drain layer 241 may be relatively uniform.

In one embodiment, for illustrative purposes, the fabrication of a N-type TFET is described. In some embodiments, the TFET may be a P-type transistor. Thus, when the voltage between the gate structure and the first doped source/drain layer is smaller than 0, a channel may be formed. The first type of doping ions may be N-type ions; and the second type of doping ions may be P-type ions.

The present disclosure also provides another exemplary fabrication method of a TFET. Comparing with the method described in FIG. 12 (or FIGS. 2-9), the major difference may include that no trench may be formed.

For example, the method for forming the first doped source/drain layer may include performing a plurality of ion implantation processes on the semiconductor substrate at the first side of the gate structure to form a source/drain structure in the semiconductor substrate at the first side of the gate structure. The source/drain structure may be include multiple layers of source/drain regions. The multiple layers of source/drain regions may be stacked along the direction perpendicular to the surface of the semiconductor substrate. The contact interface between the source/drain regions and the channel region of the semiconductor substrate may have protruding structures.

When the TFET is an N-type transistor, the ions doped by the ion implantation process may be P-type ions. When the TFET is a P-type transistor, the ions doped by the ion implantation process may be N-type ions.

In one embodiment, three times of the ion implantation processes may be performed. Specifically, the three times of ion implantation processes may include a first doping ion implantation process, a second doping ion implantation process and a third doping ion implantation process. In some embodiments, any appropriate times of the ion implantation processes may be performed according to various embodiments of the present disclosure.

In one embodiment, after performing the first doping ion implantation process on the semiconductor substrate at the first side of the gate structure, the second doping ion implantation process may be performed. After the second doping ion implantation process, the third doping ion implantation process. In some embodiments, the second doping ion implantation process may be performed before the first doping ion implantation process; and the third doping ion implantation process may be performed before the second doping ion implantation process.

In one embodiment, the parameters of the first doping ion implantation process may be referred to the parameters of the first selective ion implantation process; the parameters of the second doping ion implantation process may be referred to the parameters of the second selective ion implantation process; and the third doping ion implantation process may be referred to the parameters of the third selective ion implantation process.

The present disclosure also provides another exemplary method for fabricating a TFET. Comprising with the method described in FIGS. 2-9, the method may not include the first selective ion implantation process, the second selective ion implantation process and the third selective ion implantation process.

In one embodiment, the trench in the semiconductor substrate at the first side of the gate structure may include a first trench in the semiconductor substrate at the first side of the gate structure; and a second trench in the semiconductor substrate at the first side of the gate structure under the bottom of the first trench.

The process for forming the trench may include performing a first trench etching process on the semiconductor substrate at the first side of the gate structure to form the first trench; and performing a second trench etching process on the semiconductor substrate at the first side of the gate structure to form the second trench.

The side surface of the first trench adjacent to the gate structure may be a first cylindrical surface; and the generatrix of the first cylindrical surface may be parallel to the length direction of the gate structure. The side surface of the second trench adjacent to the gate structure may be a second cylindrical surface; and the generatrix of the second cylindrical surface may be parallel to the length direction of the gate structure.

The first trench etching process may include performing a first anisotropic etching process on the first semiconductor substrate to form a first anisotropic trench in the semiconductor substrate at the first side of the gate structure; and performing a first isotropic etching process to the first anisotropic trench to form first grooves on the side surface of the first anisotropic trench adjacent to the gate structure.

The second trench etching process may include performing a second anisotropic etching process on the first semiconductor substrate to form a second anisotropic trench in the semiconductor substrate at the first side of the gate structure; and performing a second isotropic etching process to the second anisotropic trench to form second grooves on the side surface of the second anisotropic trench adjacent to the gate structure.

In some embodiments, the first trench etching process may only include a first isotropic etching process; and the second trench etching process may only include a second isotropic etching process.

In one embodiment, the process for forming the trench may include a first trench etching process and a second trench etching process. In some embodiments, the process for forming the trench may include more than two trench etching processes.

The present disclosure also provides a tunnel field-effect transistor (TFET). FIG. 9 illustrates an exemplary TFET consistent with various disclosed embodiments of the present disclosure.

As shown in FIG. 9, the TFET may include a semiconductor substrate 200; and a gate structure formed on the semiconductor substrate 200. The portion of the semiconductor substrate 200 under the gate structure is the channel region of the TFET; and the gate structure may have a first side I and an opposing second side II. The TFET may also include a first doped source/drain layer 241 in the semiconductor substrate 200 at the first side I of the gate structure;

and a second doped source/drain layer 242 in the semiconductor substrate 200 at the second side II of the gate structure. The first doped source/drain layer 241 may be doped with a first type of doping ions. The contact interface between the first doped source/drain layer 241 and the channel region may have protruding structures protruding toward the channel region. The second doped source/drain layer 242 may be doped with a second type of doping ions; and the conductive type of the first type of doping ions may be opposite to the conductive type of the second type of doping ions. The detailed structures and intermediate structures are described above with respect to the fabrication processes.

The contact surface between the first doped source/drain layer 241 and the channel region may have a plurality of the protruding structures protruding toward the channel region. The cross-sectional view of the protruding structure along the direction perpendicular to the length (extending) direction of the gate structure may be arc-shaped.

Figure 10:
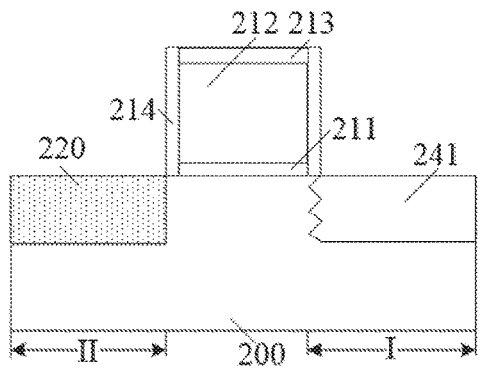
FIG. 10 illustrates another exemplary tunnel field-effect transistor consistent with various disclosed embodiments.

FIG. 10 illustrates another exemplary TFET consistent with various disclosed embodiments of the present disclosure. As shown in FIG. 10, comparing with the structure illustrated in FIG. 9, the difference may include that the cross-sectional view of the protruding structure along the direction perpendicular to the length direction of the gate structure (or perpendicular to the surface of the substrate) may be triangle-shaped.

Figure 11:
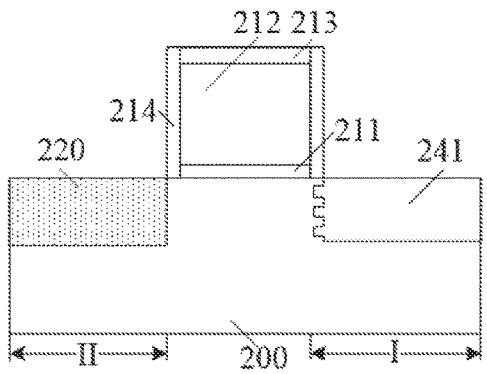
FIG. 11 illustrates another exemplary tunnel field-effect transistor consistent with various disclosed embodiments.

FIG. 11 illustrates another exemplary TFET consistent with various disclosed embodiments. As shown in FIG. 11, comparing with the structure illustrated in FIG. 9, the difference may include that the cross-sectional view of the protruding structure along the direction perpendicular to the length direction of the gate structure (or perpendicular to the surface of the substrate) may be square-shaped.

In the disclosed method for fabricating a TFET, the contact surface between the first doped source/drain layer and the channel region of the semiconductor substrate may have protruding structures protruding toward the channel region. After the channel region is turned on, because of the tip-charging effect, the protruding structures may be able to increase the electric field between the first doped source/drain layer and the second doped source/drain layer. When the channel region is turned on, a potential barrier layer may be formed between the channel region and the first doped source/drain layer or between the channel region and the second doped source/drain layer. Increasing the electric field between the first doped source/drain layer and the second doped source/drain layer may increase the possibility for the electrons to tunnel through the potential barrier layer. Accordingly, the on-current of the semiconductor structure may be increased.

Further, the TFET may be an N-type transistor, the first type of doping ions may be P-type ions. After the channel being turned on, because the conductive type of the first doped source/drain layer may be opposite to the conductive type of the channel region; and a potential barrier layer may be formed between the first doped source/drain layer and the channel region. The contact interface between the first doped source/drain layer and the channel region may have protruding structures protruding toward the channel region. Thus, the electric field at the contact interface between the first doped source/drain layer and the channel region may be substantially large. Accordingly, the electrons may be easy to tunnel through the potential barrier layer to form an electric current; and the on-current of the semiconductor structure may be increased.

Further, the TFET may be a P-type transistor, the first type of doping ions may be N-type ions. After the channel being turned on, because the conductive type of the first doped source/drain layer may be opposite to the conductive type of the channel region; and a potential barrier layer may be formed between the first doped source/drain layer and the channel region. The contact interface between the first doped source/drain layer and the channel region may have protruding structures protruding toward the channel region. Thus, the electric field at the contact interface between the first doped source/drain layer and the channel region may be increased because of the tip-charging effect. Accordingly, the electrons may be easy to tunnel through the potential barrier layer to form an electric current; and the on-current of the semiconductor structure may be increased.

Further, by performing a plurality of ion implantation processes on the semiconductor substrate at the first side of the gate structure, a doped structure may be formed. Accordingly, the etching selectivity ratio between the doped structure and the semiconductor substrate may be increased. Thus, the doped structure may be easily removed when etching the doped structure. Further, after removing the doped structure, the first doped source/drain layer may be formed in the trench, the concentration of the first type of doping ions in the first doped source/drain layer may be precisely controlled. Further, the distribution of the first type of doping ions in the first doped source/drain layer may be substantially uniform. Accordingly, the performance of the TFET may be improved.

In the disclosed TFET, the contact interface between the first doped source/drain layer and the channel region may have protruding structures protruding toward the channel region. After the channel region is turned on, the electric field between first doped source/drain layer and the second doped source/drain layer may be increased. When the channel regions is turned on, a potential barrier layer may be formed between the first doped source/drain layer and the channel region or between the second doped source/drain layer and the channel region. Increasing the electric field between the first doped source/drain layer and the second doped source/drain layer may increase the possibility for the electrons to tunnel through the potential barrier layer. Accordingly, the on-current of the semiconductor structure may be increased.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a tunnel field-effect transistor (TFET), comprising:
   providing a semiconductor substrate;
   forming a gate structure having a first side and an opposing second side on the semiconductor substrate;
   forming a first doped source/drain layer in the semiconductor substrate at the first side of the gate structure, wherein the first doped source/drain layer is doped with a first type of doping ions and a first contact interface between the first doped source/drain layer and the channel region has protruding structures protruding toward a channel region under the gate structure; and forming a second doped source/drain layer in the semiconductor substrate at the second side of the gate structure, wherein the second doped source/drain layer is doped with a second type of doping ions having a conductivity opposite to the first doped source/drain layer.

2. The method according to claim 1, wherein:
the tunnel field-effect transistor (TFET)is an N-type transistor; and
the first type of doping ions in the first doped source/drain layer are P-type ions.

3. The method according to claim 1, wherein:
the tunnel field-effect transistor (TFET) is a P-type transistor; and
the first type of doping ions in the first doped source/drain layer are N-type ions.

4. The method according to claim 1, wherein:
a second contact interface between the second doped source/drain layer and the channel region of the semiconductor substrate has protruding structures.

5. The method according to claim 1, wherein forming the first doped source/drain layer comprises:
forming a trench in the semiconductor substrate at the first side of the gate structure, wherein a side surface of the trench adjacent to the gate structure has grooves; and
forming the first doped source/drain layer in the trench and the grooves.

6. The method according to claim 5, wherein forming the trench comprises:
performing a plurality of selective ion implantation processes on the semiconductor substrate at the first side of the gate structure to form a doped structure having protruding structures in a contact interface between the doped structure and the channel region of the semiconductor substrate; and
removing the doped structure and the protruding structures to form the trench in the semiconductor substrate at the first side of the gate structure.

7. The method according to claim 6, wherein performing the plurality of selective ion implantation process comprises:
performing a first selective ion implantation process on the semiconductor substrate at the first side of the gate structure to form a first doped region in the semiconductor substrate at the first side of the gate structure;
performing a second selective ion implantation process on the semiconductor substrate at the first side of the gate structure to form a second doped region in the semiconductor substrate at the first side of the gate structure; and
performing a third selective ion implantation process on the semiconductor substrate at the first side of the gate structure to form a third doped region in the semiconductor substrate at the first side of the gate structure,
wherein the first doped region is on the second doped region and the second doped region is on the third doped region.

8. The method according to claim 7, wherein:
an implanting energy of the first selective ion implantation process is smaller than an implanting energy of the second selective ion implantation process; and
the implanting energy of the second selective ion implantation process is smaller than an implanting energy of the third selective ion implantation process.

9. The method according to claim 8, wherein:
an implanting angle of the first selective ion implantation process is in a range of approximately 0° to 7°;
the implanting energy of the first selective ion implantation process is in a range of approximately 4.5 KeV-5.5 KeV;
a dosage of the first selective ion implantation process is in a range of approximately 1.8E14 atoms/cm$^2$-2.2E14 atoms/cm$^2$;
an implanting angle of the second selective ion implantation process is in a range of approximately 0° to 2°;
the implanting energy of the second selective ion implantation process is in a range of approximately 7.2 KeV-8.8 KeV;
a dosage of the second selective ion implantation process is in a range of approximately 2.7E14 atoms/cm$^2$-3.3E14 atoms/cm$^2$;
an implanting angle of the third selective ion implantation process is in a range of approximately 0° to 2°;
the implanting energy of the third selective ion implantation process is in a range of approximately 10.5 KeV-13.5 KeV; and
a dosage of the third selective ion implantation process is in a range of approximately 3.6E14 atoms/cm$^2$-4.4E14 atoms/cm$^2$.

10. The method according to claim 6, wherein:
ions doped by the plurality of selective ion implantation processes include one or more of phosphorus ions, germanium ions, arsenic ions, boron ions, $BF_2^+$ ions, carbon ions, silicon ions, and nitrogen ions.

11. The method according to claim 6, after performing the plurality of selective ion implantation process, forming the first doped source/drain layer further comprising:
performing a thermal annealing process on the doped structure.

12. The method according to claim 5, wherein the trench comprises a first trench in the semiconductor substrate at the first side of the gate structure and a second trench in the semiconductor substrate under the first trench, wherein forming the trench comprises:
performing a first trench etching process on the semiconductor substrate at the first side of the gate structure to form a first trench in the semiconductor substrate at the first side of the gate structure, wherein a side surface of the first trench adjacent to the gate structure is a first cylindrical surface and a generatrix of the first cylindrical surface is along a length direction of the gate structure; and
performing a second trench etching process on the semiconductor substrate at the first side of the gate structure to form a second trench in the semiconductor substrate at the first side of the gate structure, wherein a side surface of the second trench adjacent to the gate structure is a second cylindrical surface and a generatrix of the second cylindrical surface is along a length direction of the gate structure.

13. The method according to claim 6, wherein removing the doped structure comprises:
performing a first etching process on the doped structure to form an initial trench in the semiconductor substrate at the first side of the gate structure; and
performing a second etching process on a side surface of the initial trench adjacent to the gate structure to form grooves on the side surface of the initial trench.

14. The method according to claim 13, wherein:
the first etching process includes an anisotropic dry etching process; and
the second etching process includes one of an isotropic dry etching process and a wet etching process.

15. The method according to claim 1, wherein forming the first doped source/drain layer comprises:
- performing a plurality of doping ion implantation processes on the semiconductor substrate at the first side of the semiconductor substrate to form a source/drain structure in the semiconductor substrate at the first side of the gate structure, wherein:
- the source/drain structure includes a plurality of source/drain regions;
- the plurality of source/drain regions are stacked along a direction perpendicular to a surface of the semiconductor substrate; and
- a contact surface between the source/drain region and the channel region of the semiconductor substrate has protruding structures.

* * * * *